United States Patent [19]
Aoki et al.

[11] Patent Number: 5,804,479
[45] Date of Patent: Sep. 8, 1998

[54] METHOD FOR FORMING SEMICONDUCTOR INTEGRATED CIRCUIT DEVICE HAVING A CAPACITOR

[75] Inventors: Hideo Aoki, Hamura; Jun Murata, Kunitachi; Yoshitaka Tadaki, Hannou; Toshihiro Sekiguchi, Hidaka; Keizo Kawakita, Ome; Takashi Hayakawa; Katsutoshi Matsunaga, both of Fussa; Kazuhiko Saitoh, Ami-machi; Michio Nishimura, Tokorozawa; Minoru Ohtsuka, Fussa; Katsuo Yuhara, Ami-machi; Michio Tanaka, Ome; Yuji Ezaki, Tsuchiura; Toshiyuki Kaeriyama, Tsukuba-gun; SongSu Cho, Fujishiro-machi, all of Japan

[73] Assignees: Hitachi, Ltd., Tokyo, Japan; Texas Instruments Inc., Dallas, Tex.

[21] Appl. No.: 694,665

[22] Filed: Aug. 9, 1996

[30] Foreign Application Priority Data

Aug. 9, 1995 [JP] Japan .................................. 7-203064
Jun. 14, 1996 [JP] Japan .................................. 8-154589

[51] Int. Cl.⁶ .............................................. H01L 21/8242
[52] U.S. Cl. ............................................................ 438/253
[58] Field of Search ...................................... 438/631, 626, 438/253, 396

[56] References Cited

U.S. PATENT DOCUMENTS 5,389,558  2/1995  Suwanai et al. ............................ 437/52
5,405,800  4/1995  Ogawa et al. .............................. 437/52

*Primary Examiner*—Jey Tsai
*Attorney, Agent, or Firm*—Antonelli, Terry, Stout & Kraus, LLP

[57] ABSTRACT

The etch-back amount of a silicon oxide film of a memory array which is a higher altitude portion is increased when etching back and flattening the silicon oxide film by arranging a first-layer wiring on a BPSG film covering an upper electrode of an information-storing capacitative element only in a peripheral circuit but not arranging it in the memory array.

Thus, a DRAM having a stacked capacitor structure is obtained such that the level difference between the memory array and peripheral circuit is decreased, and the formation of wiring and connection holes are easy.

25 Claims, 12 Drawing Sheets

METHOD FOR FORMING SEMICONDUCTOR INTEGRATED CIRCUIT DEVICE HAVING A CAPACITOR

BACKGROUND OF THE INVENTION

The present invention relates to an art for fabricating a semiconductor integrated circuit device, particularly to an art for decreasing a underlayer level difference of the wiring formed on a semiconductor substrate.

Because a recent large-capacity DRAM (Dynamic Random Access Memory) uses a stacked capacitor structure in which an information-storing capacitative element (capacitor) is arranged above a memory-cell-selecting MISFET in order to compensate for the decrease of accumulated charges (Cs) of the information-storing capacitative element because a memory cell is further microminiaturized, a level difference (difference in elevation) corresponding to the height of the information-storing capacitative element is produced between a memory array and a peripheral circuit.

Therefore, when wiring is formed over the level difference portion, out-of-focus of exposure light may occur or etching residue may be produced at the time of photolithography. Resultingly, the wiring cannot accurately be formed and thus, defects such as short circuit and wiring disconnection easily occur.

To solve the above problems, an art for flattening an interlayer insulating film for insulating the lower-layer wiring from the upper-layer wiring is indispensable. For example, in the case of the DRAM disclosed in U.S. Ser. No. 08/297,039 assigned to Hitachi, Ltd. and Hitachi Device Engineering Co., Ltd., the level difference is decreased by combining the flattening by reflow of a BPSG (Boron-doped Phospho-Silicate Glass) film with the flattening by a spin-on-glass film.

A BPSG film is made of silicon oxide containing several mol percents of boron (B) and several mol percents of phosphorus (P), which is formed by CVD and thereafter, whose surface is flattened by reflow through annealing. When a spin-on-glass film is used, a silicon oxide film is first deposited by plasma CVD and the film surface is flattened by etch-back, and thereafter the surface is spin-coated with a spin-on-glass film to put the spin-on-glass film in the lower altitude portion on the substrate. Then, the spin-on-glass film is baked to increase the density of the film and thereafter, the surface of the film is flattened by etch-back and moreover, a silicon oxide film is deposited on the surface by plasma CVD to form a flat interlayer insulating film.

SUMMARY OF THE INVENTION

The above-described interlayer-insulating-film flattening method by etch-back cannot adequately flatten the interlayer insulating film between the first-layer wiring formed on the memory array of the DRAM having the stacked capacitor structure previously described and the second-layer wiring formed on the first-layer wiring.

This is because, in the case of the above DRAM, since the level difference almost equal to the height of the information-storing capacitative element is produced between the first-layer wiring formed on the memory array and the first-layer wiring formed on a peripheral circuit and thereby, the first-layer wiring formed on the memory array which is a higher altitude portion is exposed on the surface of the interlayer insulating film when the amount of etch-back of the interlayer insulating film deposited on the first-layer wiring.

In this case, it is possible to flatten the interlayer insulating film on the memory array without exposing the wiring by greatly increasing the thickness of the interlayer insulating film. However, when greatly increasing the thickness of the film, the aspect ratio of the connection hole for connecting the first-layer wiring formed on the peripheral circuit which is a lower altitude portion to the second-layer wiring formed over the first-layer wiring increases and thereby, the connection reliability of the wiring in the connection hole lowers.

An object of the present invention is to provide an art capable of flattening the interlayer insulating film for insulating the upper-layer wiring from the lower-layer wiring.

Another object of the present invention is to provide an art capable of decreasing the aspect ratio of the connection hole formed in the interlayer insulating film for connecting the upper-layer wiring to the lower-layer wiring.

The above and other objects and novel features of the present invention will become apparent from the description of the present specification and the accompanying drawings.

The outlines of representatives of the inventions disclosed in the present application will be described below.

(1) A semiconductor integrated circuit device fabrication method of the present invention comprises the steps of:
 (a) forming a first-layer wiring on a first insulating film in a first region with a relatively lower altitude and thereafter, depositing a second insulating film covering the first-layer wiring;
 (b) etching back the second insulating film in a second region with a relatively higher altitude;
 (c) applying a spin-on-glass film onto the second insulating film and then depositing a third insulating film on the spin-on-glass film; and
 (d) forming a second-layer wiring on the third insulating film in the first region and moreover forming the second-layer wiring on the third insulating film in the second region.

(2) A semiconductor integrated circuit device fabrication method of the present invention comprises the steps of:
 (a) forming a memory-cell-selecting MISFET and a peripheral-circuit MISFET on a semiconductor substrate and thereafter, forming the information-storing capacitative element over the memory-cell-selecting MISFET;
 (b) forming a bit line over the information-storing capacitative element and thereafter, depositing a first insulating film covering the bit line;
 (c) forming a first-layer wiring on the first insulating film over the MISFET of the peripheral circuit and thereafter, depositing a second insulating film covering the first-layer wiring;
 (d) etching back the second insulating film over the bit line;
 (e) applying a spin-on-glass film onto the second insulating film and then depositing a third insulating film on the spin-on-glass film; and
 (f) forming a second-layer wiring on the third insulating film over the bit line.

(3) A semiconductor integrated circuit device fabrication method of the present invention comprises the steps of:
 (a) forming a memory-cell-selecting MISFET and a peripheral-circuit MISFET on a semiconductor substrate and thereafter, forming a bit line over the memory-cell-selecting MISFET;

(b) forming an information-storing capacitative element over the bit line and thereafter, depositing a first insulating film for covering the information-storing capacitative element;

(c) forming a first-layer wiring on the first insulating film on the peripheral-circuit MISFET and thereafter, depositing a second insulating film for covering the first-layer wiring;

(d) etching back the second insulating film on the information-storing capacitative element;

(e) applying a spin-on-glass film onto the second insulating film and then, depositing a third insulating film on the spin-on-glass film; and (f) forming a second-layer wiring on the third insulating film over the information-storing capacitative element and moreover forming a second-layer wiring on the third insulating film over the peripheral-circuit MISFET.

(4) A method for fabricating a semiconductor integrated circuit device which has a semiconductor substrate including a memory cell forming region and a peripheral circuit forming region, a memory cell including a memory-cell-selecting MISFET and an information-storing capacitative element formed in the memory cell region, and a plurality of peripheral-circuit MISFETs formed in the peripheral circuit region; the method comprising the steps of:

(a) forming a plurality of memory-cell-selecting MISFETs in the memory cell forming region, a plurality of peripheral-circuit MISFETs in the peripheral circuit forming region, and a plurality of information-storing capacitative elements over the semiconductor substrate in the memory cell forming region;

(b) forming a first insulating film on the information-storing capacitative elements in the memory cell region and on the peripheral-circuit MISFETs in the peripheral circuit forming region;

(c) forming a plurality of first wirings on the first insulating film only in the peripheral circuit region;

(d) forming a second insulating film in the memory cell forming region and the peripheral circuit forming region;

(e) removing only a predetermined thickness of the second insulating film in the memory cell forming region while masking the peripheral circuit forming region; and (f) forming a plurality of second wirings in the memory cell forming region and the peripheral-circuit forming region.

By using the above means, it is possible to increase the amount of etch-back of the second insulating film in the second region (memory array) up to a value corresponding to the film thickness of the first-layer wiring by not forming the first-layer wiring on the first insulating film in the second region with a relatively higher altitude. Moreover, by applying a spin-on-glass film to the top of the second insulating film after performing the above etch-back, it is possible to further decrease the level difference in the second region (memory array) and the first region (peripheral circuit).

By the above means, it is possible to decrease the initial film thickness of the second insulating film covering the first-layer wiring arranged in the first region (peripheral circuit). Therefore, it is possible to decrease the aspect ratio of the connection hole for connecting the first-layer wiring to the wiring over the first-layer wiring.

DESCRIPTION OF THE PREFERRED EMBODIMENT

An embodiment of the present invention will be described below referring to the accompanying drawings. However, in the drawings for explaining the embodiment, components having the same function are denoted by the same symbol and repetitive description of them is omitted.

Figure 1:
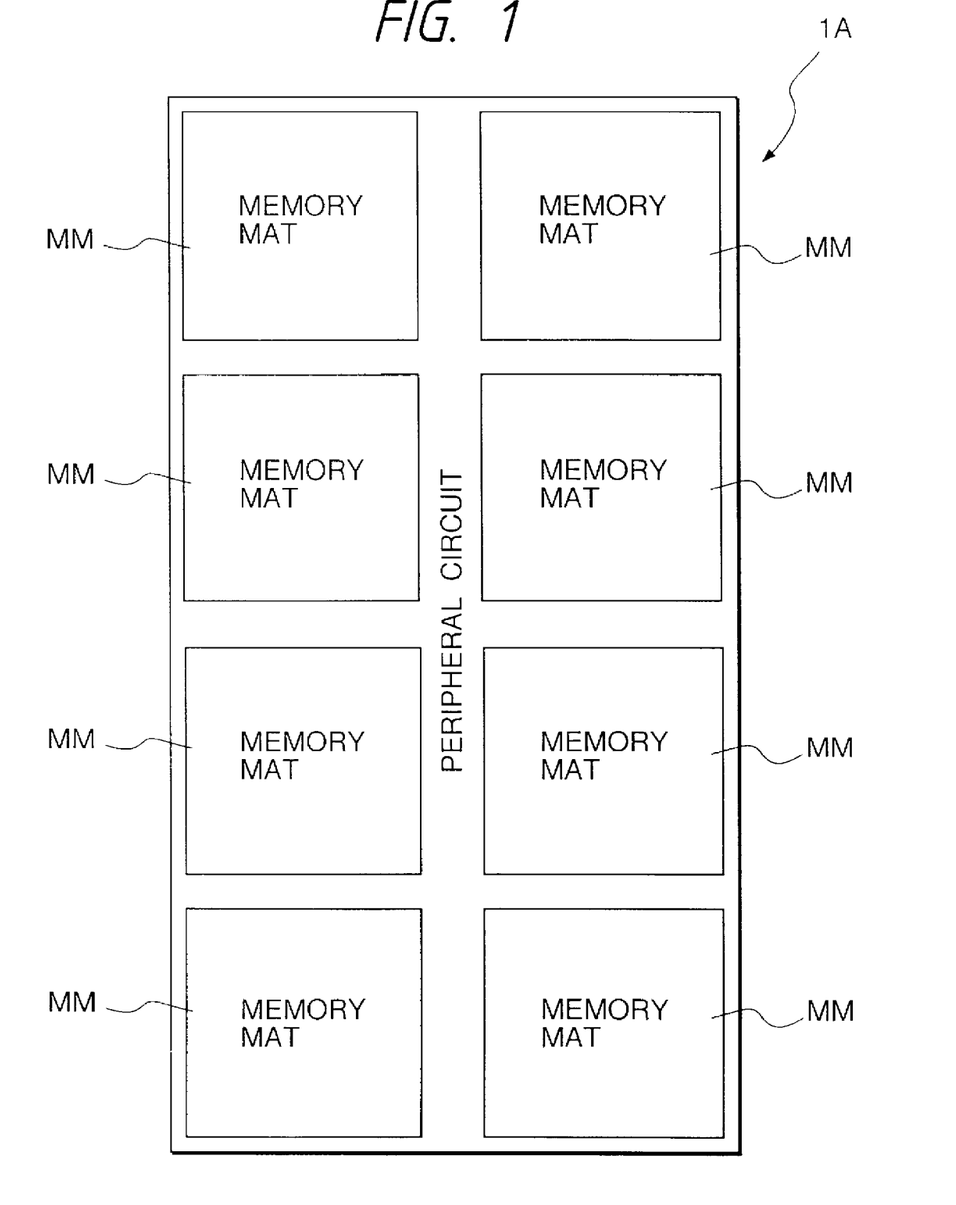
FIG. 1 is a top view of the whole of a semiconductor chip in which a DRAM of an embodiment of the present invention is formed.
Figure 2:
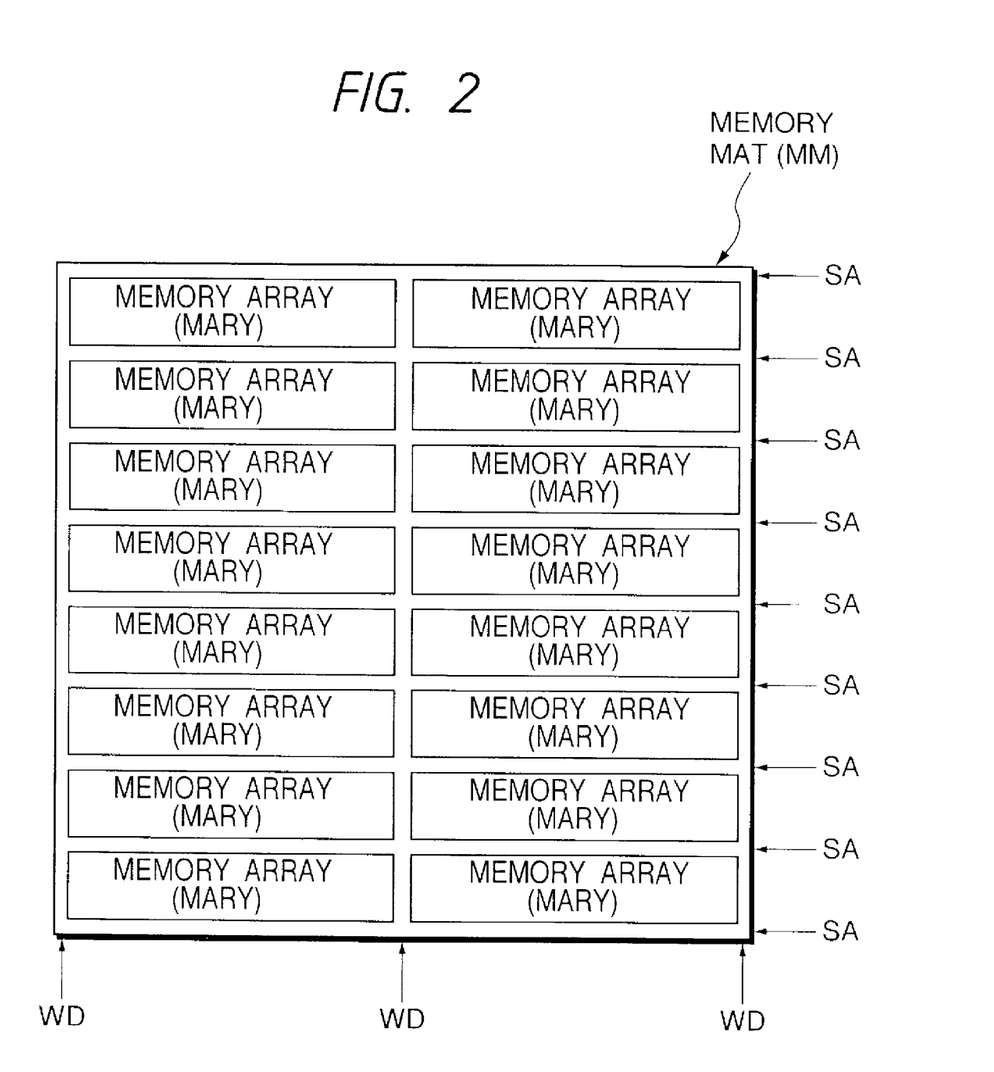
FIG. 2 is an enlarged sectional view showing a part of the chip of FIG. 1.

FIG. 1 is a top view of the whole of a semiconductor chip in which a DRAM of this embodiment is formed and FIG. 2 is an enlarged top view of a memory mat which is a part of the semiconductor chip.

A DRAM with a capacity of, for example, 64 Mbit (megabit) is formed on the principal surface of a semiconductor chip 1A made of single crystal silicon. As shown in FIG. 1, the DRAM comprises a memory mat MM divided into eight and a peripheral circuit arranged around the divided memory mats. Each of the memory mats with a capacity of 8 Mbit is divided into 16 memory arrays MARY as shown in FIG. 2. Each of the memory arrays MARY comprises memory cells of 2 Kbit (killobit)×256 bit=512 Kbit arranged like a matrix and a sense amplifier SA and a word driver WD of the peripheral circuit are arranged around the cells.

Figure 3:
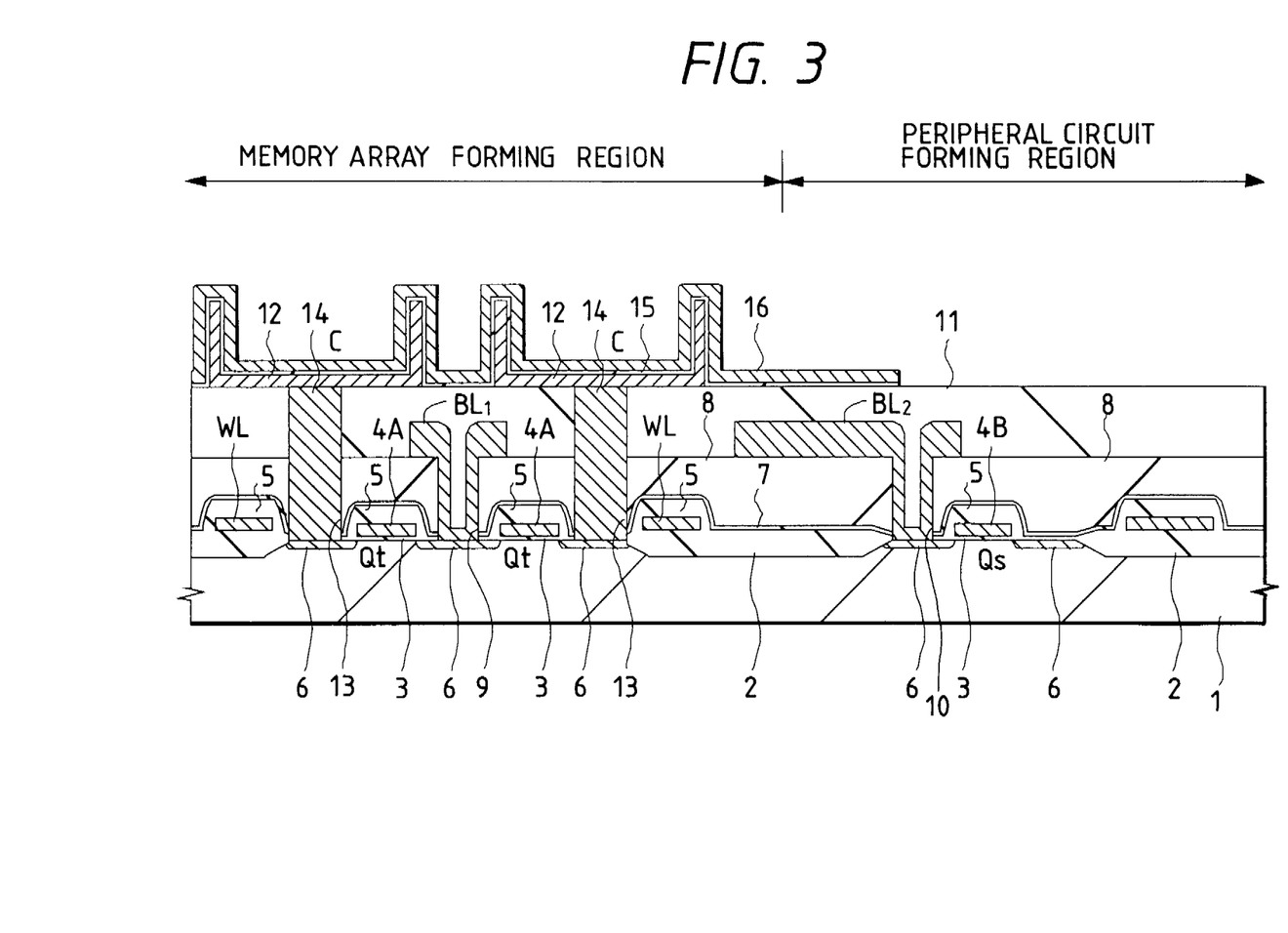
FIG. 3 is a sectional view of the essential portion of a semiconductor substrate, for illustrating a method of fabricating a DRAM which is the embodiment of the present invention.

FIG. 3 is a sectional view of a semiconductor substrate, showing the essential portion of the DRAM (a part of the memory arrays and a part of the peripheral circuit (direct peripheral circuit) adjacent to the memory arrays shown in FIG. 2). (The memory array forming region at the left of FIG. 3 and the peripheral circuit forming region at the right of FIG. 3).

As illustrated, the memory cell of the DRAM has a COB (Capacitor Over Bit-line) structure in which bit lines $BL_1$ and $BL_2$ are arranged over a memory-cell-selecting MISFET (Qt) and an information-storing capacitative element C is arranged over the bit lines $BL_1$ and $BL_2$. The information-storing capacitative element C has a structure in which a lower electrode (stacking electrode) 12, a capacitor insulating film 15, and a upper electrode 16 are built up.

To fabricate the DRAM, a field oxide film 2 is first formed on the principal surface of a semiconductor substrate 1 by a thermal oxidation (LOCOS) method, then a gate oxide film 3 is formed by thermally oxidizing the surface of an active region enclosed by the field oxide film 2, and thereafter a gate electrode 4A also serving as a word line WL of a memory cell is formed over the gate oxide film 3. The gate electrode 4A (word line WL) is formed by depositing a poly-silicon film (or polycide film obtained by forming a polysilicon film and a refractory-metal silicide film in multilayer) and a silicon oxide film 5 are deposited on the semiconductor substrate 1 by CVD and patterning these films through the etching using photoresist as a mask. At this time, a gate electrode 4B of an n-channel MISFET (Qs) (and a gate electrode of a not-illustrated p-channel MISFET) of the peripheral circuit are also formed.

Then, an n-type semiconductor region 6 (source and drain regions) of the memory-cell-selecting MISFET (Qt) and an n-type semiconductor region 6 (source and drain regions) of the n-channel MISFET (Qs) of the peripheral circuit are formed by implanting n-type impurities (e.g. phosphorus (P) ions) into the semiconductor substrate 1 and thereafter, a silicon oxide film 7 and a silicon oxide film 8 containing boron and phosphorus are deposited on the semiconductor substrate 1 by CVD. The surface of the silicon oxide film 8 is flattened by annealing it at 900 ° to 950° C.

Then, a connection hole 9 is formed in the silicon oxide film 8, and is made above one (n-type semiconductor region 6) of the source and drain regions of the memory-cell-selecting MISFET (Qt), and a connection hole 10 is made above one (n-type semiconductor region 6) of the source and drain regions of the n-channel MISFET (Qs) of the peripheral circuit by etching the silicon oxide films 8 and 7.

Then, the polysilicon film (or polycide film) deposited on the silicon oxide film 8 by CVD is patterned to form a bit line $BL_1$ connected to the n-type semiconductor region 6 of the memory-cell-selecting MISFET (Qt) through the connection hole 9 and a bit line $BL_2$ connected to the n-type semiconductor region 6 of the n-channel MISFET (Qs) of the peripheral circuit through the connection hole 10.

Then, the lower electrode 12 of the information-storing capacitative element C is formed over the bit lines $BL_1$ and $BL_2$. To form the lower electrode 12, a BPSG film 11 is first deposited over the bit lines $BL_1$ and $BL_2$ by CVD, the surface of the film 11 is flattened by reflow, and then a connection hole 13 is formed by etching the BPSG film 11 and silicon oxide films 8 and 7 over the other of the source and drain regions (n-type semiconductor region 6) of the memory-cell-selecting MISFET (Qt) to bury a polysilicon plug 14 in the connection hole 13, and thereafter the polysilicon film (or polycide film) deposited on the BPSG film 11 by CVD is patterned.

Then, the capacitor insulating film 15 of the information-storing capacitative element C is formed on the lower electrode 12 and the upper electrode 16 of the information-storing capacitative element C is formed on the capacitor insulating film 15. The capacitor insulating film 15 and the upper electrode 16 are formed by depositing a silicon nitride film (or $Ta_2O_5$ film) on the lower electrode 12 by CVD and then depositing a polysilicon film (or titanium nitride (TiN) film) over the silicon nitride film and thereafter, patterning these films. In this case, the lower electrode 12 has a height of approx. 7,000 to 8,000 Å.

Figure 4:
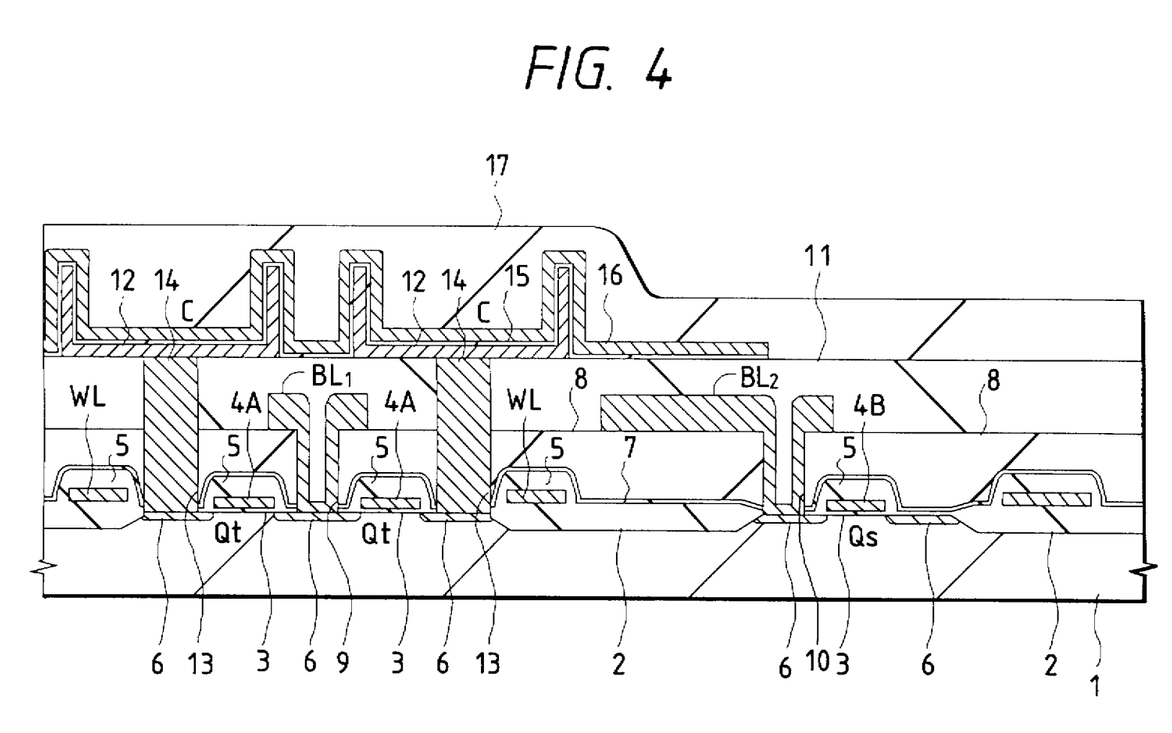
FIG. 4 is a sectional view of the essential portion of a semiconductor substrate, for illustrating a method of fabricating a DRAM which is the embodiment of the present invention.

Then, as shown in FIG. 4, a BPSG film 17 is deposited on the information-storing capacitative element C by CVD. Because the DRAM of this embodiment uses a stacked capacitor structure in which the information-storing capacitative element C is formed over a memory-cell-selecting MISFET (Qt), the BPSG film 17 of the memory array has a relatively higher altitude and the BPSG film 17 of the peripheral circuit has a relatively lower altitude.

Figure 5:
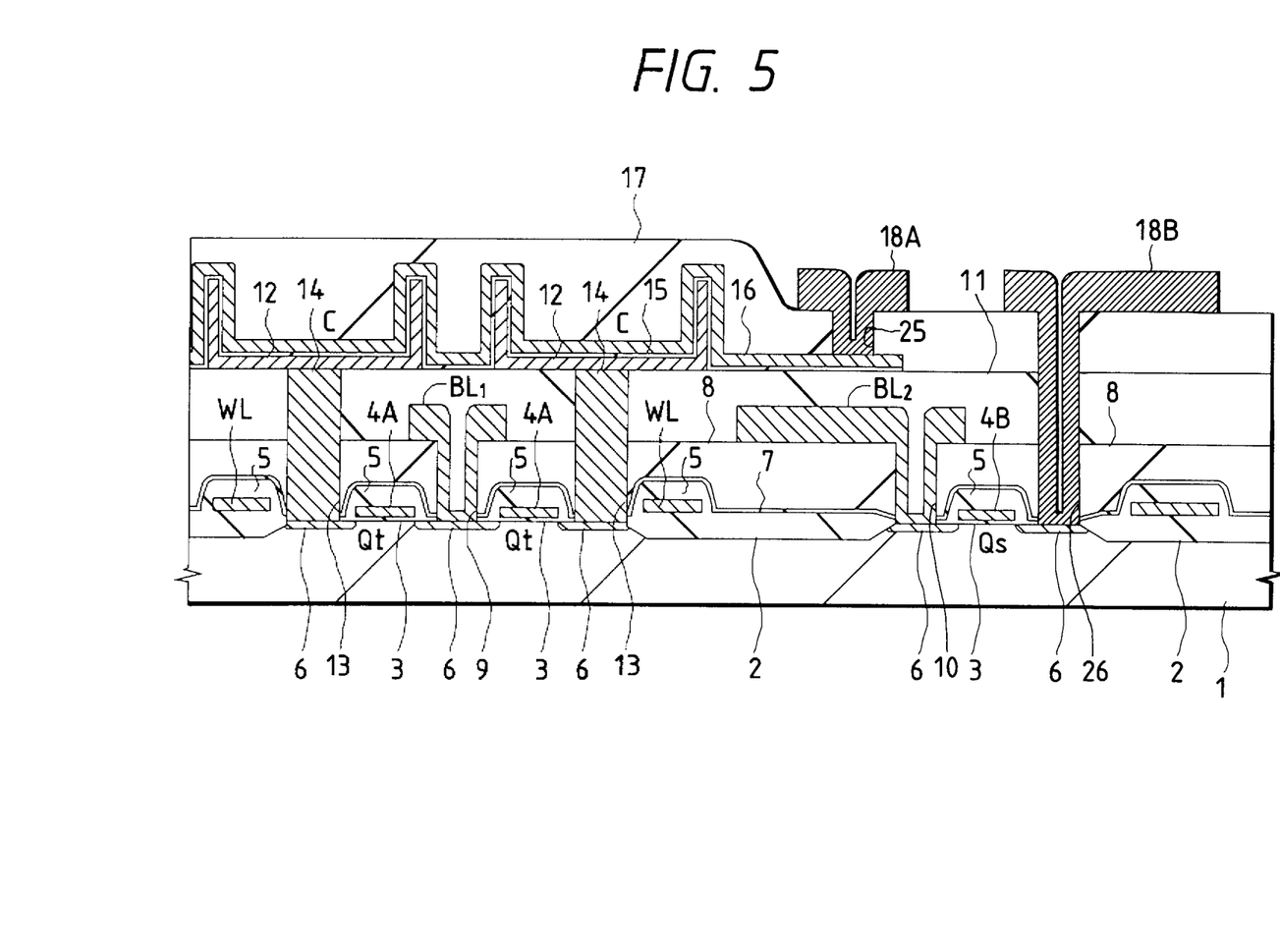
FIG. 5 is a sectional view of the essential portion of a semiconductor substrate, for illustrating a method of fabricating a DRAM which is the embodiment of the present invention.

Then, as shown in FIG. 5, a connection hole 25 is made over the upper electrode 16 of the information-storing capacitative element C by etching the BPSG film 17 and a connection hole 26 is made over the other (n-type semiconductor region 6) of the source and drain regions of the n-channel MISFET (Qs) of the peripheral circuit by etching the PBSG films 17 and 11 and the silicon oxide film 8 and thereafter, first-layer wirings 18A and 18B are formed on the BPSG film 17. In this case, the first-layer wirings are arranged only in the peripheral circuit but they are not arranged in the memory array. The wirings 18A and 18B are formed by patterning a three layer film composed of a TiN film, a W (tungsten) film, and a TiN film. The TiN film is deposited by reactive sputtering and the W film is deposited by CVD. The first-layer wiring has a film thickness of 4,000 to 5,000 Å.

Figure 6:
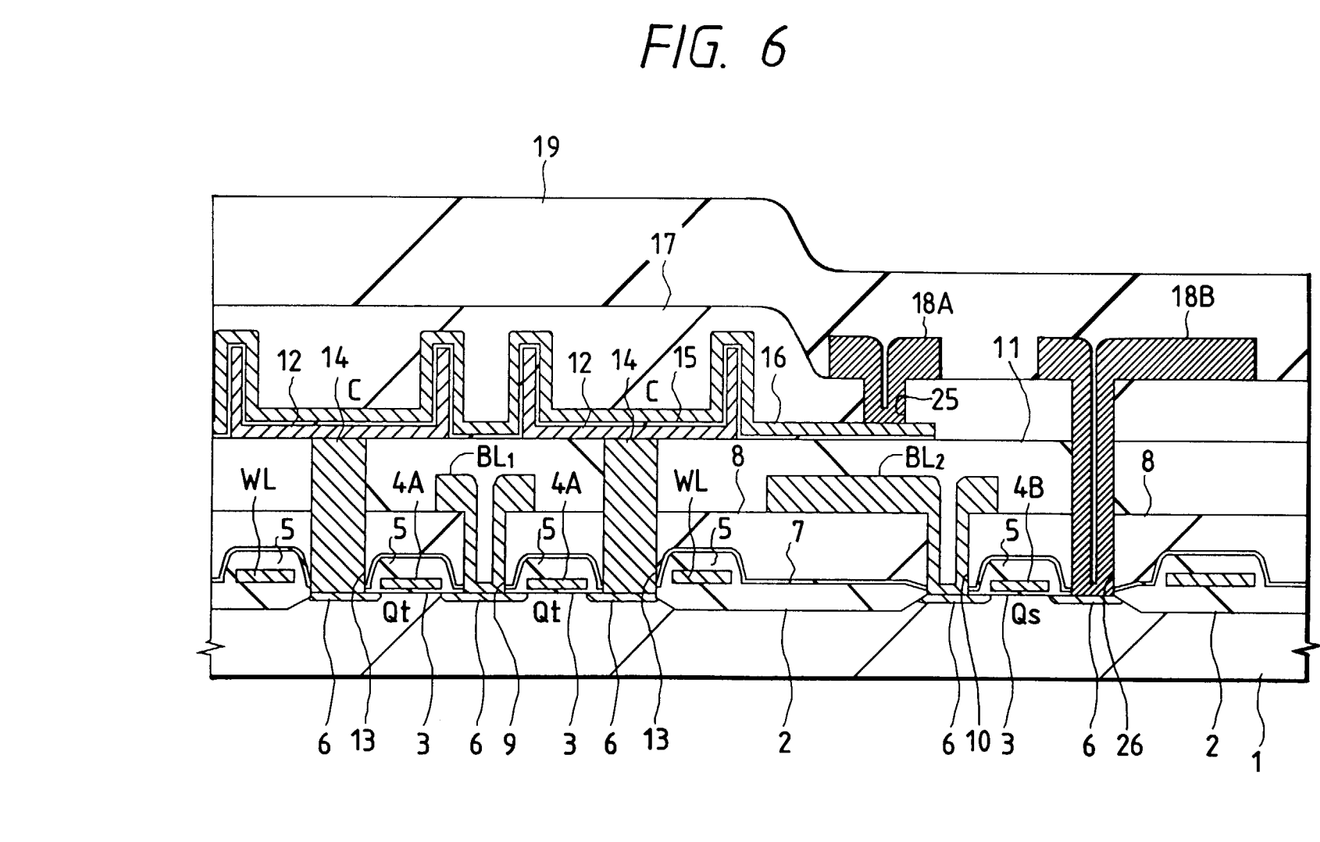
FIG. 6 is a sectional view of the essential portion of a semiconductor substrate, for illustrating a method of fabricating a DRAM which is the embodiment of the present invention.
Figure 7:
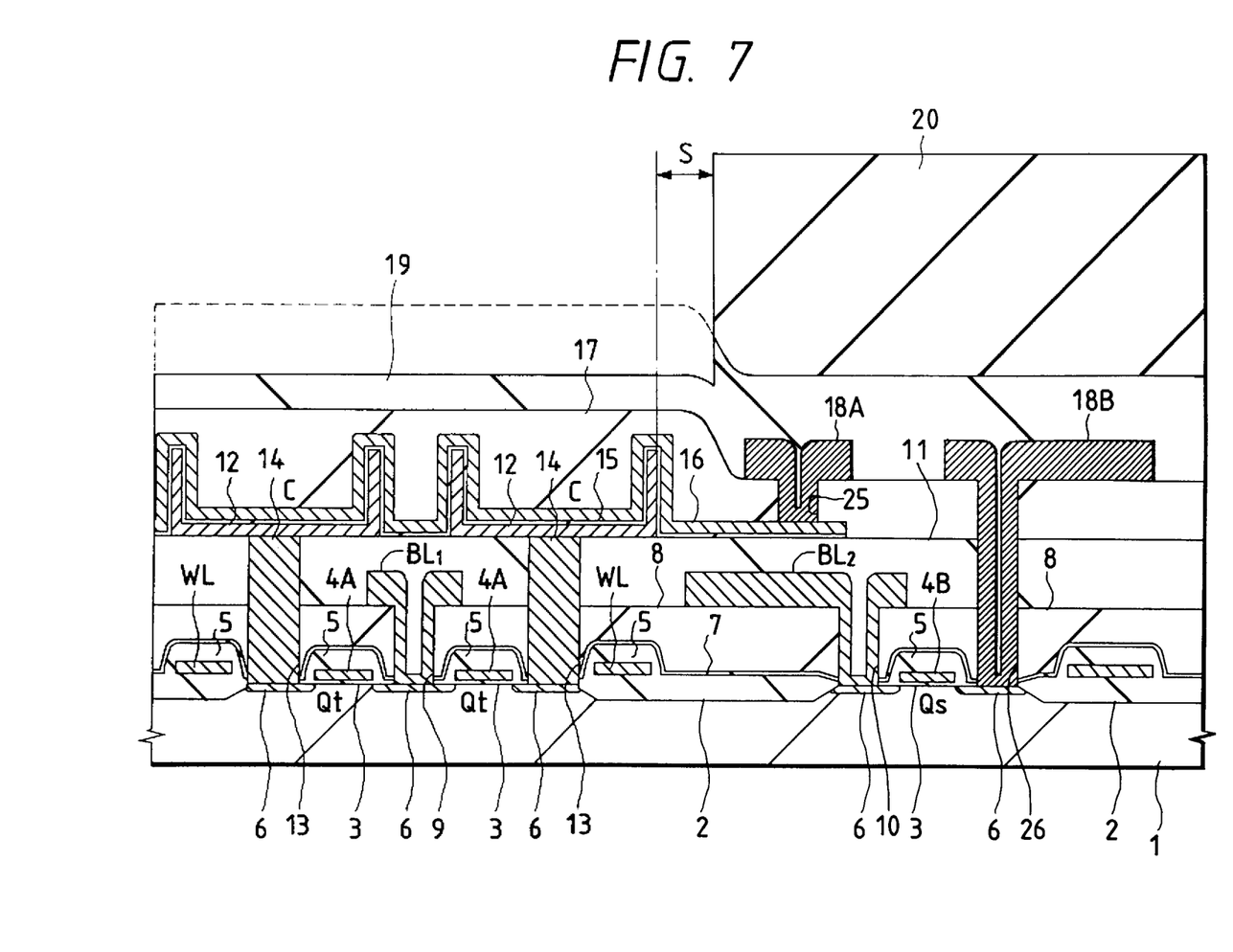
FIG. 7 is a sectional view of the essential portion of a semiconductor substrate, for illustrating a method of fabricating a DRAM which is the embodiment of the present invention.

Then, as shown in FIG. 6, a silicon oxide film 19 is deposited on the first-layer wirings 18A and 18B up to a thickness of 4,000 to 5,000 Å by plasma CVD. Thereafter, as shown in FIG. 7, the silicon oxide film 19 of the memory array which is a higher altitude portion is etched back (removed) by using the photoresist formed so as to cover the peripheral circuit region which is a lower altitude portion as a mask 20 up to a predetermined thickness. In this case, the mask 20 has a pattern for exposing the memory array forming region. That is, the lower electrode (node electrode) of the information-storing capacitative element of the memory cell is completely exposed from the mask 20. However, because no first-layer wiring is arranged on the memory array which is a higher altitude portion, it is possible to perform the above etch-back until the surface of the BPSG film 17 covering the upper electrode 16 of the information-storing capacitative element C is exposed. That is, by arranging no first-layer wiring on the higher altitude portion (memory array), it is possible to increase the amount of etch-back of the silicon oxide film 19 of the higher altitude portion (memory array) up to a value equivalent to the film thickness of the wiring.

Figure 8:
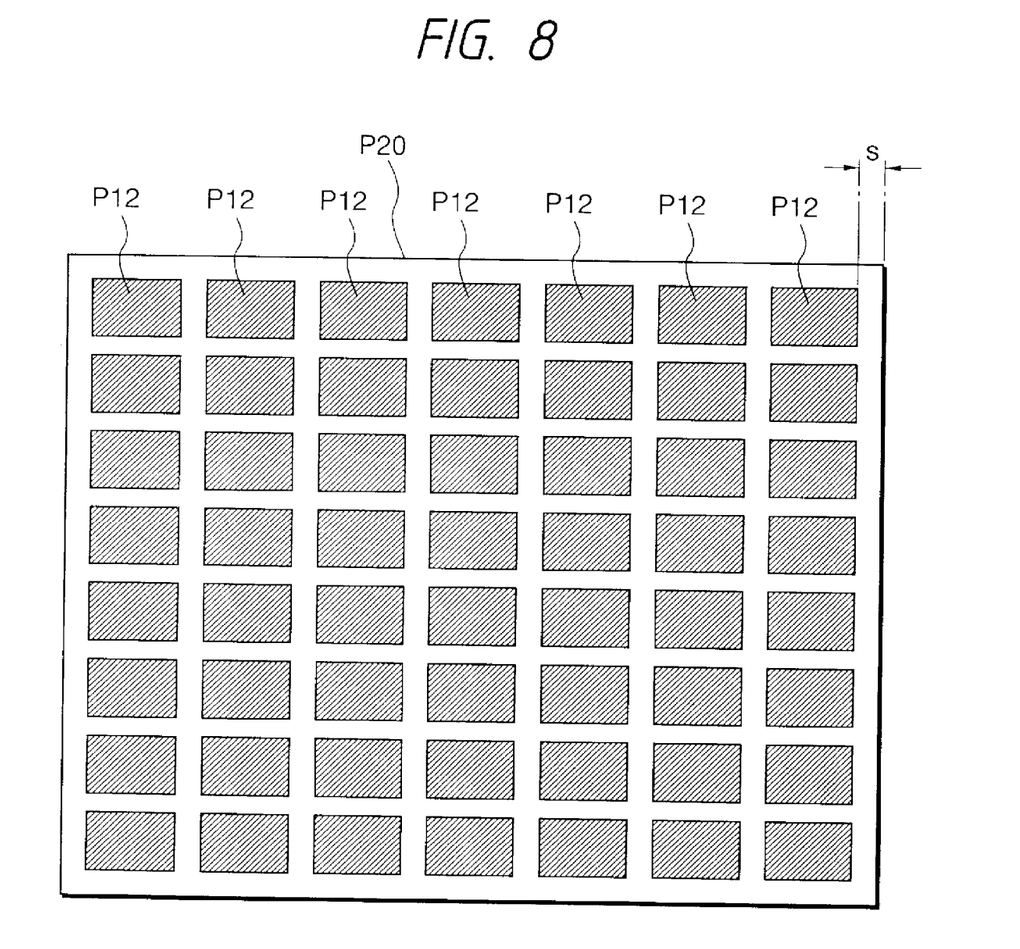
FIG. 8 is a top view showing a mask pattern of photoresist used to etch back a silicon oxide film.
Figure 9:
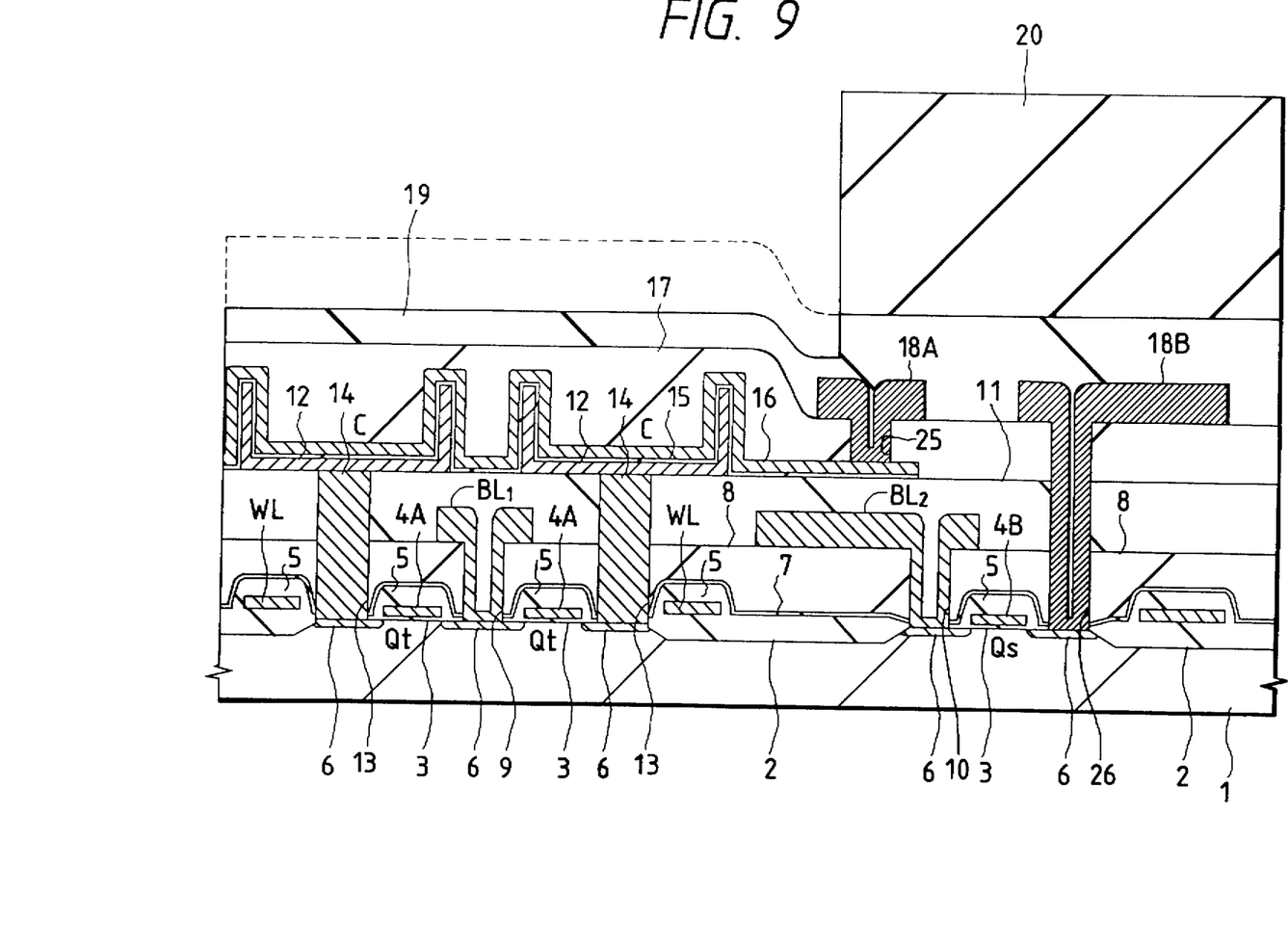
FIG. 9 is a sectional view of the essential portion of a semiconductor substrate, for illustrating a method of fabricating a DRAM which is the embodiment of the present invention.

An end of the photoresist 20 serving as a mask for etching back the silicon oxide film 19 is set so that the end completely covers the lower electrode 12 of the information-storing capacitative element C and the distance (S) from an end of the lower electrode 12 is in a range between approx. 0.5 and 1.5 μm. That is, as shown in FIG. 8, the photoresist 20 for etching back the silicon oxide film 19 is formed by using a photomask having an opening pattern (P20) obtained by broadening a pattern (P12) group for forming the lower electrode 12 of the information-storing capacitative element C by approx. 0.5 to 1.5 μm. When the distance (S) between the end of the photoresist 20 and that of the lower electrode 12 is almost in the above range, it is possible that the end of the photoresist 20 is located on the wiring (18A) of the peripheral circuit as shown in FIG. 9.

Figure 10:
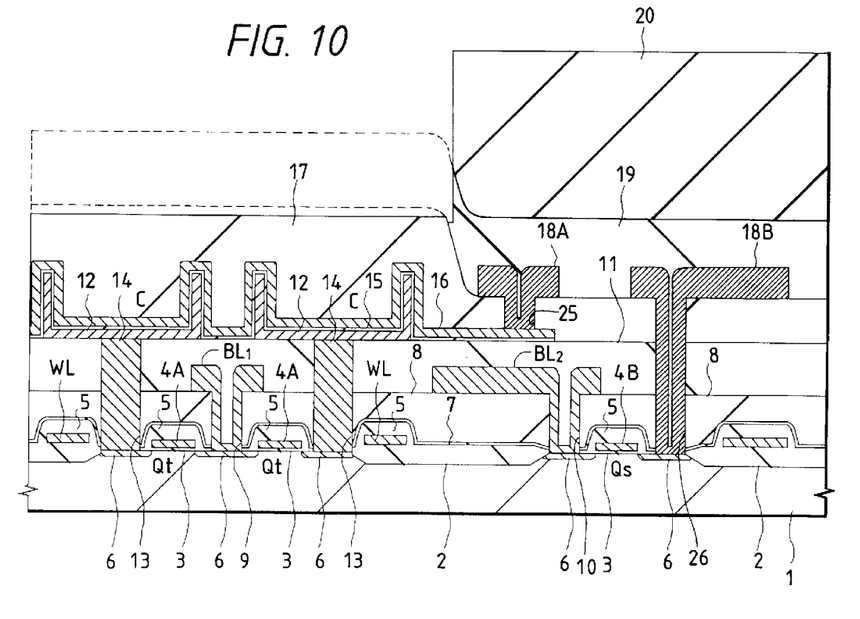
FIG. 10 is a sectional view of the essential portion of a semiconductor substrate, for illustrating a method of fabricating a DRAM which is the embodiment of the present invention.

When the level difference between the memory array and the peripheral circuit is large, as shown in FIG. 10 it is possible to etch back the silicon oxide film 19 of the memory array and thereafter locally etch back the BPSG film 17 under the film 19 (so that the upper electrode 16 is not exposed).

Figure 11:
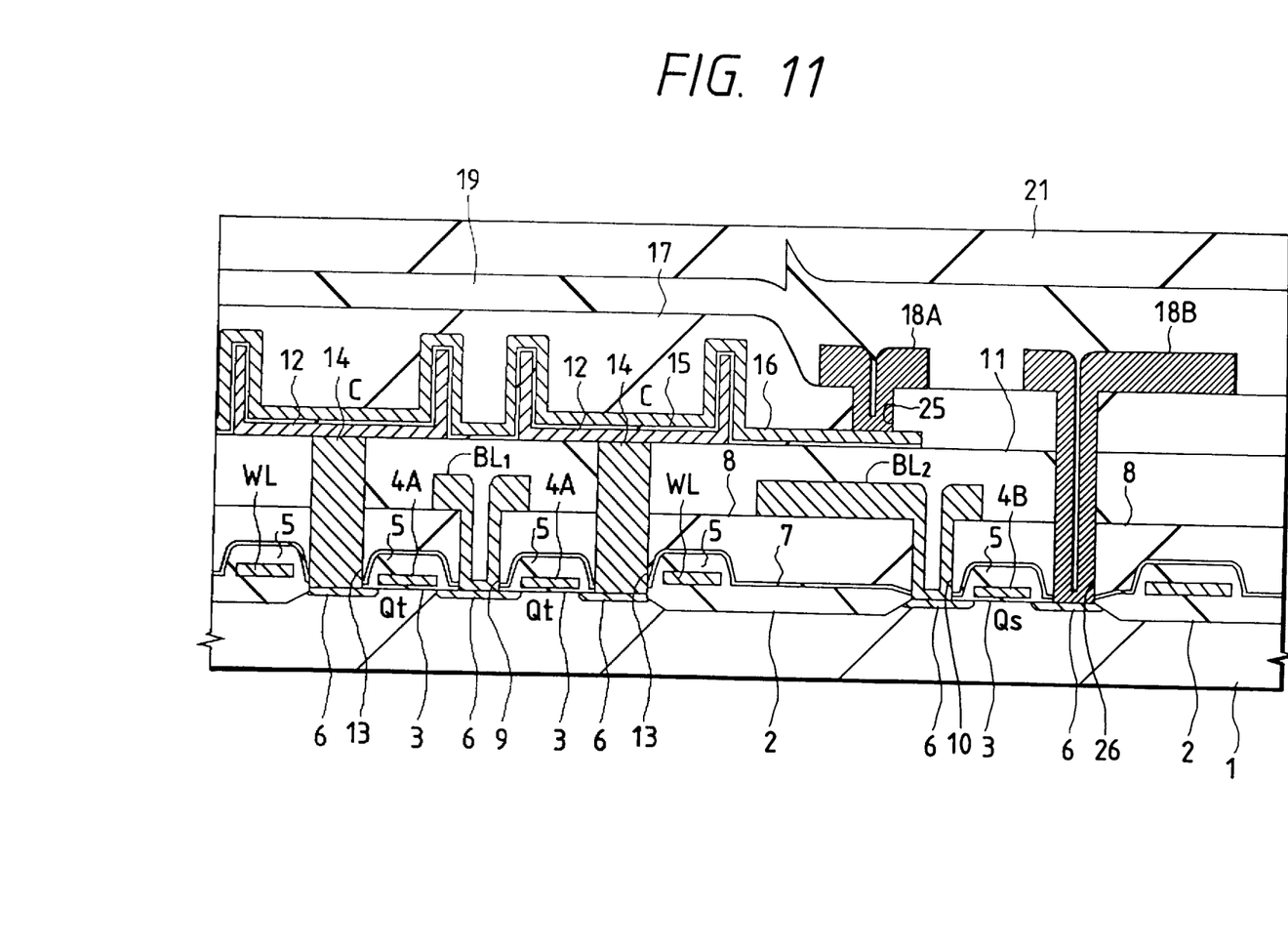
FIG. 11 is a sectional view of the essential portion of a semiconductor substrate, for illustrating a method of fabricating a DRAM which is the embodiment of the present invention.

Then, as shown in FIG. 11, after the photoresist 20 is removed, a spin-on-glass film 21 is applied to the top of the silicon oxide film 19 in order to almost completely eliminate a small level difference left between the above etched-back memory array and the peripheral circuit. In this case, if the level difference cannot be eliminated only by application of the spin-on-glass film 21, the spin-on-glass film 21 is etched back, as necessary.

Figure 12:
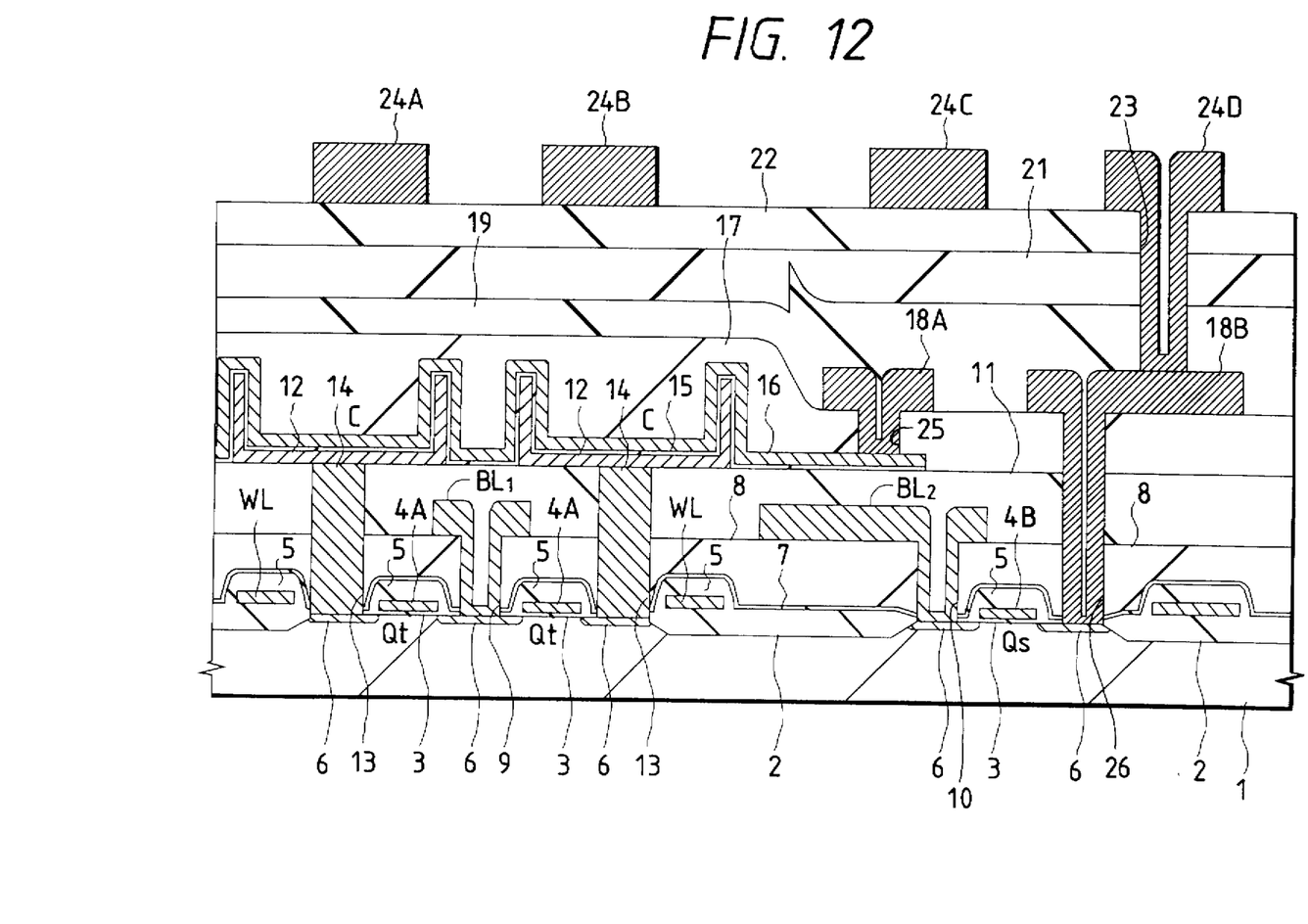
FIG. 12 is a sectional view of the essential portion of a semiconductor substrate, for illustrating a method of fabricating a DRAM which is the embodiment of the present invention.

Then, as shown in FIG. 12, a connection hole 23 reaching the wiring 18B of the first layer is made in the spin-on-glass film 21 by etching a silicon oxide 22 deposited by CVD and the spin-on-glass film 21 and thereafter, second-layer wirings 24A to 24D are formed on the silicon oxide film 22. In this case, some (wirings 24A and 24B) of the second-layer wirings are arranged on the memory array and others (wirings 24C and 24D) are arranged on the peripheral circuit. The second-layer wirings 24A to 24D are formed by patterning a three-layer film consisting of a TiN film, an aluminum (Al) film, and a TiN film. The TiN film is deposited by reactive sputtering and the Al film is deposited by Al-film sputtering. Before depositing the TiN film on the Al film, it is preferable to prevent the Al film from being etched when developing photoresist for patterning the wirings 24A to 24D by vacuum-heating the Al film at 200° to 300° C. for 30 sec to 2 min.

Thereafter, though not illustrated, the DRAM of this embodiment is almost completed by depositing an interlayer insulating film on the second-layer wirings 24A to 24D and forming a connection hole in the interlayer insulating film and thereafter, forming third-layer wirings on the interlayer insulating film. The interlayer insulating film is composed of three layers of, for example, a silicon oxide film deposited by plasma CVD, a spin-on-glass film deposited by spin-coating, and a silicon oxide film deposited by plasma CVD. For the etching to make a connection hole in the interlayer insulating film, it is preferable to use an etching gas to which carbon monoxide (CO) is added in order to prevent by-products of etching reaction from reattaching to the inside of the connection hole.

Therefore, according to this embodiment, it is possible to increase the amount of etch-back of the silicon oxide film 19 of the memory array which is a higher altitude portion when etching back and flattening the film 19 covering the first-layer wirings (18A and 18B) by arranging the wirings (18A and 18B) formed on the BPSG film 17 covering the upper electrode 16 of the information-storing capacitative element C only over the peripheral circuit but not arranging the wirings over the memory array. Thus, it is possible to sufficiently decrease the level difference between the memory array and the peripheral circuit.

Moreover, by forming the first-layer wirings only in the peripheral circuit region, it is possible to decrease the level difference between the memory array region and the peripheral circuit region by a value equivalent to the film thickness of the first-layer wirings.

Furthermore, by etching back the silicon oxide film 19 and thereafter applying the spin-on-glass film 21 onto the silicon oxide film 19, it is possible to further decrease the level difference between the memory array and the peripheral circuit.

Thereby, because the underlying layer (silicon oxide film 22) of the second-layer wirings 24A to 24D can completely be flattened, out-of-focus of exposure light does not occur or etching residue is not produced at the time of the photolithography for forming the wirings 24A to 24D. Thus, the accuracy of forming the wirings 24A to 24D is improved and it is possible to prevent the defect such as a short circuit or wiring disconnection from occurring. Moreover, it is possible to improve the reliability of connection between the wirings 24A to 24D and wirings of other wiring layers (wirings of the first and second layers).

Furthermore, this embodiment makes it possible to decrease the initial film thickness of the silicon oxide film 19 covering the first-layer wirings 18A and 18B arranged on the peripheral circuit. Therefore, it is possible to decrease the aspect ratio of the connection hole for connecting the first-layer wirings 18A and 18B with wirings (second-or third-layer wirings) above the wirings 18A and 18B and improve the reliability of connection of the wirings in the connection hole.

The invention made by the present inventor has been specifically described above as related to the embodiment. However, the present invention is not restricted to the embodiment. It is needless to say that various modifications of the present invention are allowed as long as they do not deviate from the gist of the present invention.

For the above embodiment, the present invention is applied to methods for fabricating a DRAM provided with a memory cell having a COB structure where an information-storing capacitative element is formed on a bit line. Moreover, the present invention can be applied to methods for fabricating a DRAM in which an information-storing capacitative element is arranged on a memory cell and a bit line is further arranged on the information-storing capacitative element.

Furthermore, the present invention can generally widely be applied to methods for fabricating an LSI in which multilayer wiring is formed on a substrate where a region with a lower altitude and a region with a higher altitude are formed.

Advantages which representatives of the inventions disclosed in the present application have will be briefly described below.

According to the present invention, it is possible to decrease the level difference of a region with a relatively higher altitude (memory array) and a region with a relatively lower altitude (peripheral circuit). Therefore, it is possible to prevent a short circuit or disconnection of wirings formed on the level difference.

According to the present invention, it is possible to decrease the initial film thickness of the insulating film covering wirings arranged in a region with a relatively lower altitude (peripheral circuit). Therefore, it is possible to decrease the aspect ratio of the connection hole for connecting the above wirings to the upper-layer wirings and improve the reliability of connection between upper and lower wirings.

What is claimed is:

1. A method of fabricating a semiconductor integrated circuit device having a DRAM provided with a memory cell constituted by arranging a bit line over the gate electrode of a memory-cell-selecting MISFET formed on a semiconductor substrate and an information-storing capacitative element on the bit line, the method comprising the steps of:

(a) forming a memory-cell-selecting MISFET and a MISFET of a peripheral circuit on a semiconductor substrate and thereafter forming a bit line over the gate electrode of the memory-cell-selecting MISFET;

(b) forming an information-storing capacitative element over the bit line and thereafter depositing a first insulating film covering the information-storing capacitative element;

(c) forming a first-layer wiring on the first insulating film only over the peripheral circuit and thereafter depositing a second insulating film covering the first-layer wiring;

(d) etching back the second insulating film over the information-storing capacitative element;

(e) applying a spin-on-glass film onto the second insulating film and then depositing a third insulating film on the spin-on-glass film; and (f) forming a second-layer wiring on the third insulating film over the information-storing capacitative element and moreover forming a second-layer wiring on the third insulating film over the MISFET of the peripheral circuit.

2. The method for fabricating a semiconductor integrated circuit device according to claim 1, wherein the second insulating film is etched back by using a photomask having an opening pattern formed by broadening a pattern for forming a lower electrode of the information-storing capacitative element up to approx. 0.5 to 1.5 $\mu$m.

3. The method for fabricating a semiconductor integrated circuit device according to claim 2, wherein the second insulating film is only partly etched back.

4. The method for fabricating a semiconductor integrated circuit device fabrication method according to claim 2, wherein the second insulating film and the first insulating film under the second insulating film are partly etched back.

5. A method of fabricating a semiconductor integrated circuit device including a semiconductor substrate having a memory cell forming region and a peripheral circuit forming region, a memory cell having a memory-cell-selecting MISFET and an information-storing capacitative element formed in the memory cell forming region, and a plurality of peripheral-circuit MISFETs formed in the peripheral circuit forming region, the method comprising the steps of:

(a) forming a plurality of memory-cell-selecting MISFETs in the memory cell forming region and a plurality of peripheral-circuit MISFETs in the peripheral circuit forming region and forming a plurality of information-storing capacitative elements over the semiconductor substrate in the memory cell forming region;

(b) forming a first insulating film on the information-storing capacitative element formed in the memory cell forming region and on the peripheral-circuit MISFETs in the peripheral circuit forming region;

(c) forming a plurality of first wirings on the first insulating film only in the peripheral circuit forming region;

(d) forming a second insulating film in the memory cell forming region and peripheral circuit forming region;

(e) removing the second insulating film in the memory cell forming region up to a predetermined thickness while masking the peripheral circuit forming region; and (f) forming a plurality of second wirings in the memory cell forming region and peripheral circuit forming region.

6. The method for fabricating a semiconductor integrated circuit device according to claim 5, wherein the mask has a pattern for completely exposing the lower electrode of the information-storing capacitative element.

7. The method for fabricating a semiconductor integrated circuit device according to claim 5, wherein the mask is formed so as to cover the first wirings connected to the upper electrode of the information-storing capacitative element.

8. The method for fabricating a semiconductor integrated circuit device according to claim 5, wherein the step of forming a bit line electrically connected to the memory-cell-selecting MISFET is further included, the bit line is provided on the gate electrode of the memory-cell selecting MISFET, and the lower electrode of the information-storing capacitative element is superposed on the bit line.

9. The method for fabricating a semiconductor integrated circuit device according to claim 5, wherein a third insulating film is further formed in the memory cell forming region and peripheral circuit forming region after the step (e).

10. The method for fabricating a semiconductor integrated circuit device according to claim 5, wherein at the step (e), the second insulating film of the portion exposed from the mask is completely removed and the first insulating film is also removed up to a predetermined thickness.

11. A method of fabricating a semiconductor integrated circuit device including a semiconductor substrate having a memory cell forming region and a peripheral circuit forming region, with each memory cell having a memory-cell-selecting MISFET and an information-storing capacitor element, having upper and lower electrodes, formed in the memory cell forming region, and with a plurality of peripheral-circuit MISFETs formed in the peripheral circuit forming region, the method comprising the steps of:

(a) forming a plurality of memory-cell-selecting MISFETs in the memory cell forming region, forming the plurality of peripheral-circuit MISFETs in the peripheral circuit forming region, and forming a plurality of information-storing capacitor elements over the semiconductor substrate in the memory cell forming region;

(b) forming a first insulating film over the information-storing capacitor elements formed in the memory cell forming region and over the peripheral circuit MISFETs in the peripheral circuit forming region, said first insulating film having a through-hole over one of source and drain regions of the peripheral-circuit MISFETs in the peripheral circuit forming region;

(c) forming a plurality of first wirings on the first insulating film only in the peripheral circuit forming region, with first wirings being electrically connected to said one of source and drain regions of the peripheral-circuit MISFETs;

(d) forming a second insulating film in the memory cell forming region and peripheral circuit forming region;

(e) removing said second insulating film in the memory cell forming region while masking the peripheral circuit forming region with a mask and exposing a portion over the information-storing capacitor elements in the memory cell forming region; and (f) forming a plurality of second wirings in the memory cell forming region and peripheral circuit forming region.

12. A method of fabricating a semiconductor integrated circuit device according to claim 11, wherein the mask does not overlie at all the lower electrodes of the information-storing capacitor elements.

13. A method of fabricating a semiconductor integrated circuit device according to claim 11, wherein other first wirings are connected to the upper electrodes of the information-storing capacitor elements, and wherein the mask is formed so as to cover the first wirings connected to the upper electrode of the information-storing capacitor elements.

14. A method of fabricating a semiconductor integrated circuit device according to claim 11, further comprising the step of:

forming a bit line electrically connected to the memory-cell-selecting MISFET, said bit line being provided over a gate electrode of the memory-cell-selecting MISFET, and the lower electrode of the information-storing capacitor element being superposed on the bit line.

15. A method of fabricating a semiconductor integrated circuit device according to claim 11, wherein said mask overlies end portions of the upper electrodes of the information-storing capacitor elements, and does not overlie end portions of the lower electrodes of the information-storing capacitor elements.

16. A method of fabricating a semiconductor integrated circuit device including a semiconductor substrate having a memory cell forming region and a peripheral circuit forming region, with each memory cell having a memory-cell-selecting MISFET and an information-storing capacitor element, having upper and lower electrodes, formed in the memory cell forming region, and with a plurality of peripheral-circuit MISFETs formed in the peripheral circuit forming region, the method comprising the steps of:

(a) forming a plurality of memory-cell-selecting MISFETs in the memory cell forming region, forming the plurality of peripheral-circuit MISFETs in the peripheral circuit forming region, and forming a plurality of information-storing capacitor elements over the semiconductor substrate in the memory cell forming region;

(b) forming a first insulating film over the information-storing capacitor elements formed in the memory cell forming region and over the peripheral-circuit MISFETs in the peripheral circuit forming region, said first insulating film having a through-hole over one of source and drain regions of the peripheral-circuit MISFETs in the peripheral circuit forming region;

(c) forming a plurality of first wirings on the first insulating film except said memory cell forming region, with first wirings being electrically connected to said one of source and drain regions of the peripheral-circuit MISFETs;

(d) forming a second insulating film in the memory cell forming region and peripheral circuit forming region;

(e) removing said second insulating film in the memory cell forming region using a mask which exposes a portion over said information-storing capacitor elements in the memory cell forming region; and (f) forming a plurality of second wirings in the memory cell forming region and peripheral circuit forming region.

17. A method of fabricating a semiconductor integrated circuit device according to claim 16, wherein the mask does not overlie at all the lower electrodes of the information-storing capacitor elements.

18. A method of fabricating a semiconductor integrated circuit device according to claim 16, wherein other first wirings are connected to the upper electrodes of the information-storing capacitor elements, and wherein the mask is formed so as to cover the first wirings connected to the upper electrodes of the information-storing capacitor elements.

19. A method of fabricating a semiconductor integrated circuit device according to claim 16, further comprising the step of:

forming a bit line electrically connected to the memory-cell-selecting MISFET, said bit line being provided over a gate electrode of the memory-cell-selecting MISFET, and the lower electrode of the information-storing capacitor element being superposed on the bit line.

20. A method of fabricating a semiconductor integrated circuit device according to claim 16, wherein said mask overlies end portions of the upper electrodes of the information-storing capacitor elements, and does not overlie end portions of the lower electrodes of the information-storing capacitor elements.

21. A method of fabricating a semiconductor integrated circuit device including a semiconductor substrate having a memory cell forming region and a peripheral circuit forming region, with each memory cell having a memory-cell-selecting MISFET and an information-storing capacitor element, having upper and lower electrodes, formed in the memory cell forming region, and with a plurality of peripheral-circuit MISFETs formed in the peripheral circuit forming region, the method comprising the steps of:

(a) forming a plurality of memory-cell-selecting MISFETs in the memory cell forming region, forming the plurality of peripheral-circuit MISFETs in the peripheral circuit forming region, and forming a plurality of information-storing capacitor elements over said the memory-cell-selecting MISFET in the memory cell forming region;

(b) forming a first insulating film over the information-storing capacitor elements formed in the memory cell forming region and over the peripheral-circuit MISFETs in the peripheral circuit forming region;

(c) forming first wirings over the first insulating film in the peripheral circuit forming region except in the memory cell forming region;

(d) forming a second insulating film over the first insulating film in the memory cell forming region and over said first wirings in the peripheral circuit forming region;

(e) etching the second insulating film in the memory cell forming region using a mask covering the peripheral circuit region and exposing the memory cell forming region; and (f) forming a plurality of second wirings in the memory cell forming region and the peripheral circuit forming region.

22. A method of fabricating a semiconductor integrated circuit device according to claim 21, wherein said mask does not overlie at all the lower electrodes of the information-storing capacitive elements.

23. A method of fabricating a semiconductor integrated circuit device according to claim 21, wherein other first wiring are connected to the upper electrodes of the information-storing capacitor elements, and wherein said mask is formed so as to cover the first wirings connected to the upper electrodes of the information-storing capacitor elements.

24. A method of fabricating a semiconductor integrated circuit device according to claim 21, further comprising the step of forming a bit line electrically connected to the memory-cell-selecting MISFET, said bit line being formed over a gate electrode of the memory-cell-selecting MISFET, and said information-storing capacitor element is over said bit line.

25. A method of fabricating a semiconductor integrated circuit device according to claim 11, wherein said mask overlies end portions of the upper electrodes of the information-storing capacitor elements, and does not overlie end portions of the lower electrodes of the information-storing capacitor elements.

* * * * *